(12) United States Patent
Fukuda et al.

(10) Patent No.: US 10,230,136 B2
(45) Date of Patent: Mar. 12, 2019

(54) MONITORING SENSOR INCLUDING A POLYMER MATRIX FOR MONITORING A SEALED SECONDARY BATTERY, SEALED SECONDARY BATTERY INCLUDING THE MONITORING SENSOR, AND MONITORING METHOD FOR SEALED SECONDARY BATTERY

(71) Applicant: TOYO TIRE & RUBBER CO., LTD., Osaka-shi, Osaka (JP)

(72) Inventors: Takeshi Fukuda, Osaka (JP); Nobuyuki Minakata, Osaka (JP)

(73) Assignee: TOYO TIRE CORPORATION, Itami-shi (JP)

( * ) Notice: Subject to any disclaimer, the term of this patent is extended or adjusted under 35 U.S.C. 154(b) by 5 days.

(21) Appl. No.: 15/306,631

(22) PCT Filed: Apr. 9, 2015

(86) PCT No.: PCT/JP2015/061127
§ 371 (c)(1),
(2) Date: Oct. 25, 2016

(87) PCT Pub. No.: WO2015/198684
PCT Pub. Date: Dec. 30, 2015

(65) Prior Publication Data
US 2017/0047621 A1    Feb. 16, 2017

(30) Foreign Application Priority Data

Jun. 27, 2014 (JP) .................................. 2014-132913
Nov. 27, 2014 (JP) .................................. 2014-240207

(51) Int. Cl.
*H01M 10/48* (2006.01)
*G01L 9/14* (2006.01)
(Continued)

(52) U.S. Cl.
CPC ............... *H01M 10/48* (2013.01); *G01L 9/14* (2013.01); *G01R 31/3679* (2013.01); *G01B 7/24* (2013.01);
(Continued)

(58) Field of Classification Search
CPC .......... G01L 11/00; G01L 9/14; H01M 10/48; H01M 10/0525; H01M 2200/20;
(Continued)

(56) References Cited

U.S. PATENT DOCUMENTS 5,680,029 A * 10/1997 Smits ................... H01M 10/46
320/107
2001/0038940 A1 11/2001 Okumura et al.
(Continued)

FOREIGN PATENT DOCUMENTS

JP   2001-345123   12/2001
JP   2002-289265   10/2002
(Continued)

OTHER PUBLICATIONS

International Search Report dated Jun. 23, 2015, issued in counterpart International Application No. PCT/JP2015/061127 (1 page).
(Continued)

*Primary Examiner* — Jay Patidar
(74) *Attorney, Agent, or Firm* — Westerman, Hattori, Daniels & Adrian, LLP

(57) ABSTRACT

A monitoring sensor for a sealed secondary battery 1 including a sealed outer casing 21 and an electrode group 22 accommodated in the inside of the sealed outer casing 21, including a polymer matrix layer 3 that is disposed in the inside of the outer casing 21 and a detection unit 4 that is disposed on the outside of the outer casing 21, wherein the polymer matrix layer 3 contains a filler that is dispersed therein and that changes an external field in accordance with
(Continued)

deformation of the polymer matrix layer 3, and the detection unit 4 detects change in the external field.

10 Claims, 6 Drawing Sheets

(51) Int. Cl.
   *G01R 31/36* (2019.01)
   *H01M 2/02* (2006.01)
   *G01B 7/24* (2006.01)
   *H01M 10/0525* (2010.01)

(52) U.S. Cl.
   CPC ........ *H01M 2/022* (2013.01); *H01M 10/0525* (2013.01); *H01M 2200/20* (2013.01)

(58) Field of Classification Search
   CPC .......... H01M 2/02; H01M 2/022; H01M 2/04; G01R 31/3679; G01B 7/24
   See application file for complete search history.

(56) References Cited

U.S. PATENT DOCUMENTS

| | | | |
|---|---|---|---|
| 2005/0110460 A1* | 5/2005 | Arai ...................... | B60L 3/0046 320/116 |
| 2008/0036456 A1* | 2/2008 | Kishida .................. | G01R 33/04 324/244 |
| 2009/0218163 A1* | 9/2009 | Takeuchi .................. | G01L 1/14 180/446 |
| 2009/0246607 A1 | 10/2009 | Shinyashiki et al. | |
| 2013/0245402 A1* | 9/2013 | Ziaie ...................... | G01N 27/72 600/309 |
| 2014/0002269 A1* | 1/2014 | Zhou ................... | H01M 10/482 340/636.11 |
| 2015/0253207 A1* | 9/2015 | Shigeto .................... | G01B 7/24 73/862.625 |
| 2016/0084911 A1* | 3/2016 | Mensah-Brown ... | G01N 29/022 318/139 |

FOREIGN PATENT DOCUMENTS

| | | | |
|---|---|---|---|
| JP | 2004-25961 A | | 1/2004 |
| JP | 2004331038 A | * | 11/2004 |
| JP | 2005-207841 | * | 8/2005 |
| JP | 2008234840 A | * | 10/2008 |
| JP | 2009-76265 A | | 4/2009 |
| JP | 2009076265 A | * | 4/2009 |
| JP | 2009-245879 A | | 10/2009 |
| JP | WO 2012073770 A1 | * | 6/2012 ............. H01G 11/78 |
| JP | 2013-145716 A | | 7/2013 |
| JP | 2014-98688 A | | 5/2014 |
| JP | 2014-98689 A | | 5/2014 |
| JP | 2014098688 A | * | 5/2014 |

OTHER PUBLICATIONS

Notification of Transmittal of Translation of the International Preliminary Report on Patentability (Form PCT/IB/338) issued in counterpart International Application No. PCT/JP2015/061127 dated Jan. 5, 2017 with Forms PCT/IB/373 and PCT/ISA/237. (6 pages).
Office Action dated Oct. 30, 2017, issued in counterpart Korean Application No. 10-2016-7036189, with English translation. (13 pages).
Office Action dated Mar. 27, 2018, issued in counterpart Korean Application No. 10-2016-7036189, with English translation. (7 pages).

* cited by examiner

MONITORING SENSOR INCLUDING A POLYMER MATRIX FOR MONITORING A SEALED SECONDARY BATTERY, SEALED SECONDARY BATTERY INCLUDING THE MONITORING SENSOR, AND MONITORING METHOD FOR SEALED SECONDARY BATTERY

TECHNICAL FIELD

The present invention relates to a sensor for monitoring an inside state of a sealed secondary battery, a sealed secondary battery on which the sensor is mounted, and a method for monitoring an inside state of a sealed secondary battery.

BACKGROUND ART

In recent years, a sealed secondary battery (which may be hereinafter simply referred to as "secondary battery") represented by a lithium ion secondary battery is used as a power source not only for a mobile apparatus such as a portable phone or a notebook personal computer but also for an electrically driven vehicle such as an electric automobile or a hybrid car. A cell constituting the secondary battery has a structure in which an electrode group is accommodated in an inside of a sealed outer casing, and the electrode group is constructed by winding or stacking a positive electrode and a negative electrode with a separator interposed therebetween. Generally, a laminate film such as an aluminum laminate foil or a metal can having a cylindrical shape or a prismatic shape is used as the outer casing.

Such a secondary battery has a problem that, when the electrolytic solution is decomposed due to overcharging or the like, the cell swells to be deformed in accordance with rise in the internal pressure caused by the decomposition gas and, unless the charging current or the discharging current is stopped, this results in rupture of the secondary battery. In order to cope with this problem, a safety valve is conventionally provided that is opened when an internal pressure comes to have a predetermined value or more (for example, about 1 to 2 MPa); however, this has another problem because the electrolytic solution is scattered to contaminate the surroundings when the safety valve is opened. Therefore, it is desirable to monitor an inside state of the cell so that the rupture can be prevented even if the safety valve is not opened. For that purpose, there is a need for a technique capable of detecting, with a high degree of sensitivity, the internal pressure change of the cell or the electrode swelling (dilation deformation of the electrode group) accompanying the charging and discharging of the cell.

Patent Document 1 discloses a monitoring apparatus in which a pressure sensor is disposed in an inside space of a safety valve of a lithium secondary battery, and the pressure detected by the sensor is displayed on a displaying device. However, this necessitates an electric wire from the pressure sensor located in the inside of the container to the displaying device located on the outside of the container. Therefore, unless a structure for sealing the surroundings of the electric wire is added, the sealed structure is hindered. Also, Patent Document 2 discloses a sealed storage battery including a pressure-sensitive electroconductive rubber that changes a resistance value thereof in accordance with rise in the internal pressure provided in a battery case. However, an electric wire from the inside to the outside of the battery case is provided, and a special structure for retaining the sealed structure is needed in the battery case.

Patent Document 3 discloses a laminate-type battery in which, in a part of a welded part in which the fringes of a laminate film are welded to each other, a part in which metal layers are in contact with each other without intervention of a resin layer is formed, and rise in the internal pressure is detected by change in the voltage value or change in the resistance value of the metal layer when that part is peeled off. However, in this battery, detection is not carried out unless the internal pressure becomes so high that the welded part is peeled off. Also, forming the part, in which the resin layer is absent or the metal layer is exposed at the welded part can disadvantageously be a cause of breakdown.

PRIOR ART DOCUMENTS

Patent Documents

Patent Document 1: JP-A-2002-289265
Patent Document 2: JP-A-2001-345123
Patent Document 3: JP-A-2009-245879

SUMMARY OF THE INVENTION

Problems to be Solved by the Invention

The present invention has been made in view of the above-described circumstances, and an object thereof is to provide a monitoring sensor for a sealed secondary battery capable of detecting, with a high degree of sensitivity, the internal pressure change of the cell or the electrode swelling without hindering the sealed structure, a sealed secondary battery, and a monitoring method for a sealed secondary battery.

Means for Solving the Problems

The object can be achieved by the following present invention. The present invention provides a monitoring sensor for a sealed secondary battery including a sealed outer casing and an electrode group accommodated in an inside of the sealed outer casing, comprising: a polymer matrix layer that is disposed in the inside of the outer casing; and a detection unit that is disposed on an outside of the outer casing, wherein the polymer matrix layer contains a filler that is dispersed therein and that changes an external field in accordance with deformation of the polymer matrix layer, and the detection unit detects change in the external field.

In this sensor, when the internal pressure of the cell rises or when electrode swelling accompanying the charging and discharging increases, the polymer matrix layer is deformed in the inside of the outer casing in accordance therewith, and change in the external field accompanying the deformation of the polymer matrix layer is detected by the detection unit disposed on the outside of the outer casing. Because the sensor has such a construction of defecting change in the external field, there is no need for an electric wire from the polymer matrix layer to the defection unit, and therefore, the sealed structure is not hindered. Moreover, because the polymer matrix layer is disposed in the inside of the outer casing, the internal pressure change of the cell and the electrode swelling can be detected with a high degree of sensitivity.

In the monitoring sensor for a sealed secondary battery in accordance with the present invention, it is preferable that the polymer matrix layer contains a magnetic filler as the filler, and the detection unit detects change in a magnetic field as the external field. With such a construction, change in the magnetic field accompanying the deformation of the polymer matrix layer can be detected without a wire. Also, because a Hall element having a wide sensitivity region can be used as the detection unit, detection with a high degree of sensitivity can be made in a wider range.

It is preferable that an elastic modulus of the polymer matrix layer is from 0.01 to 10 MPa. When the elastic modulus is smaller than 0.01 MPa, the handling property of the polymer matrix layer is deteriorated, thereby malting the handling difficult. Also, when the elastic modulus is larger than 10 MPa, the polymer matrix layer becomes less likely to be deformed, so that the sensor sensitivity tends to deteriorate. The elastic modulus is a compressive elastic modulus as measured in accordance with JIS K-7312.

It is preferable that the polymer matrix layer is covered with a protective film for preventing elution into an electrolytic solution. With such a construction, elution of the polymer matrix layer disposed in the inside of the outer casing into the electrolytic solution is prevented, so that the sensor sensitivity can be ensured successfully.

It is preferable that the filler is unevenly distributed in a thickness direction of the polymer matrix layer, and a region that is located on one side and that contains a relatively larger amount, of the filler is directed toward the electrode group. With such a construction, the change in the external field corresponding to small deformation of the polymer matrix layer increases, so that the sensor sensitivity can be enhanced with respect to low internal pressure or slight electrode swelling. Also, in such a case in which the filler is unevenly distributed, a region that is located on the other side in the polymer matrix layer and that contains a relatively smaller amount of the filler may be formed of a foamed body containing bubbles. In this case, the polymer matrix layer becomes more likely to be deformed, so that the sensor sensitivity can be enhanced to a greater extent.

It is preferable that the polymer matrix layer is attached to an inner surface of the outer casing and is disposed to be distant from the electrode group. Attaching of the polymer matrix layer to the inner surface of the outer casing is comparatively easy and can be easily stabilized, thereby making the productivity and the stability of the sensor excellent. Alternatively, the polymer matrix layer may be attached to the electrode group. In this case, electrode swelling accompanying the charging and discharging can be detected.

A sealed secondary battery according to the present invention is one in which the above-described monitoring sensor is mounted. In such a sealed secondary battery, change in the external field is used in detecting the internal pressure change or the electrode swelling, so that there is no need for an electric wire from the polymer matrix layer to the defection unit, and therefore, the sealed structure is not hindered. Moreover, because the polymer matrix layer is disposed in the inside of the outer casing, the internal pressure change of the cell and the electrode swelling can be detected with a high degree of sensitivity.

A monitoring method for a sealed secondary battery according to the present invention is a method including detecting change in the external field accompanying the deformation of the polymer matrix layer by the detection unit, and detecting internal pressure change or electrode swelling of the sealed secondary battery on a basis of the detected change in the external field, by using the monitoring sensor described above.

According to this method, when the internal pressure of the cell rises or when electrode swelling accompanying the charging and discharging increases, the polymer matrix layer is deformed in the inside of the outer casing in accordance therewith, and change in the external field accompanying the deformation of the polymer matrix layer is detected by the detection unit disposed on the outside of the outer casing. Because such a method of detecting change in the external field is adopted, there is no need for an electric wire from the polymer matrix layer to the defection unit, and therefore, the sealed structure is not hindered. Moreover, because the polymer matrix layer is disposed in the inside of the outer casing, the internal pressure change of the cell and the electrode swelling can be detected with a high degree of sensitivity.

MODE FOR CARRYING OUT THE INVENTION

An embodiment of the present invention will be explained with reference to the drawings.

Figure 1:
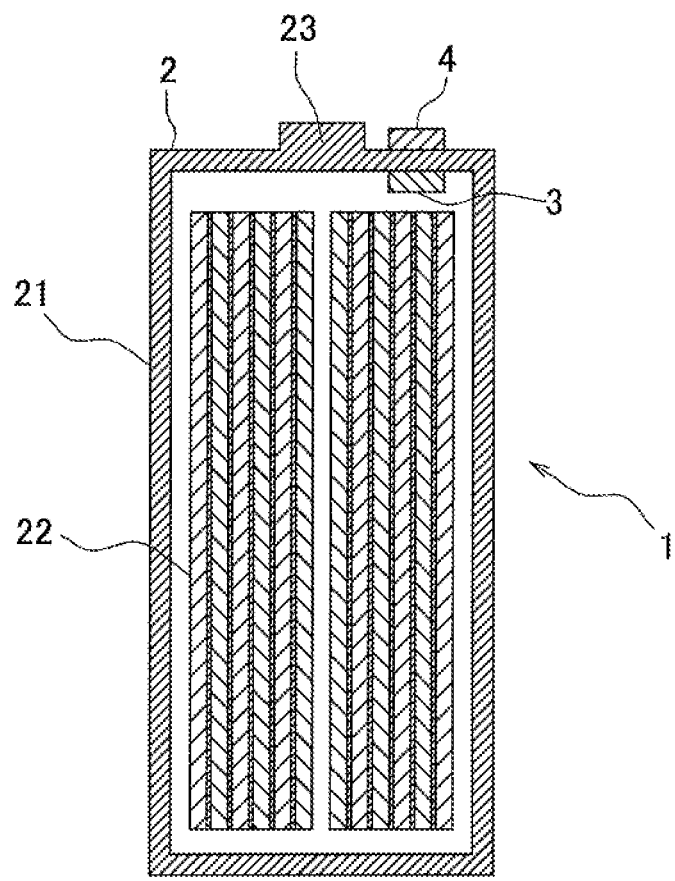
FIG. 1 is a sectional view schematically illustrating one example of a monitoring sensor for a sealed secondary battery according to the present invention.

On a sealed secondary battery 1 shown in FIG. 1, a monitoring sensor including a polymer matrix layer 3 and a detection unit 4 is mounted. A cell 2 constituting this secondary battery 1 has a structure in which an electrode group 22 is accommodated in the inside of a sealed outer casing 21. The electrode group 22 is constructed by winding or stacking a positive electrode and a negative electrode with a separator interposed therebetween, and an electrolytic solution is held by the separator. In the present embodiment, the outer casing 21 is a cylindrical metal can, and the electrode group 22 has a cylindrically wound structure. For the outer casing 21, a prismatic metal can may be used, or a laminate film such as an aluminum laminate foil may be used, for example.

This secondary battery 1 has a sealed structure in which the outer casing 21 is air-tightly sealed. The polymer matrix layer 3 is disposed in the inside of the outer casing 21, and the detection unit 4 is disposed on the outside of the outer casing 21. An electric: wire for connecting the polymer matrix layer 3 and the detection unit 4 with each other is not provided, so that the polymer matrix layer 3 and the detection unit 4 are in a non-connected state. The polymer matrix layer 3 contains a filler that is dispersed therein and that changes an external field in accordance with deformation of the polymer matrix layer 3. The detection unit 4 detects change in the external field.

When an internal pressure of the cell 2 rises due to decomposition of the electrolytic solution or the like caused by overcharging, the polymer matrix layer 3 is deformed in accordance therewith, and change in the external field accompanying the deformation of the polymer matrix layer 3 is detected by the detection unit 4. The polymer matrix layer 3 disposed in the inside of the outer casing 21 can possibly be deformed not only in accordance with swelling of the outer casing 21 but also in accordance with rise in the internal pressure constituting the cause of the swelling, so that the change in the internal pressure of the cell 2 can be detected with a high degree of sensitivity. Detection signals that are output from the detection unit 4 are forwarded to a controlling apparatus not illustrated in the drawings, so that the inside state of the cell 2 is monitored over time.

When change in the external field larger than or equal to a set value is detected by the detection unit 4, a switching circuit that is not illustrated in the drawings and that is connected to the controlling apparatus shuts off the energization and stops the charging current or the discharging current, thereby preventing troubles such as rupture of the secondary battery 1. Although not illustrated in detail in the drawings, the secondary battery 1 is provided with a safety valve 23 that is opened when the internal pressure of the cell 2 comes to have a predetermined value or higher (for example, 1 to 2 MPa). This monitoring sensor makes it possible to detect a rise in the internal pressure under a pressure that is lower than the internal pressure at which the safety valve 23 is opened. Therefore, a suitable measure such as shutting off the energization can be taken before the safety valve 23 is opened to scatter the electrolytic solution to the surroundings.

As described above, this monitoring sensor uses change in the external field in detecting change in the internal pressure of the cell 2, so that there is no need for an electric wire from the polymer matrix layer 3 to the detection unit 4, and therefore, there is no need for an electric wire from the inside to the outside of the outer casing 21. For this reason, the sealed structure of the secondary battery 1 is not hindered by the monitoring sensor, and there is no need to add a structure for sealing the surroundings of the electric wire to the outer casing 21. This means that a practical range for application of the monitoring sensor is widely ensured.

In the present, embodiment, the polymer matrix layer 3 contains a magnetic filler as the above-described filler, and the detection unit 4 defects change in a magnetic field as the above-described external field. In this case, the polymer matrix layer 3 is preferably a magnetic elastomer layer in which the magnetic filler is dispersed in a matrix that contains an elastomer component.

The magnetic filler may be, for example, a rare-earth-based, iron-based, cobalt-based, nickel-based, or oxide-based filler; however, a rare-earth-based filler is preferable because a higher magnetic force can be obtained. The shape of the magnetic filler is not particularly limited, so that the shape may be any one of spherical, flattened, needle-like, prismatic, and amorphous shapes. The average particle size of the magnetic filler is preferably from 0.02 to 500 µm, more preferably from 0.1 to 400 µm, and still more preferably from 0.5 to 300 µm. When the average particle size is smaller than 0.02 µm, the magnetic characteristics of the magnetic filler tend to deteriorate. On the other hand, when the average particle size exceeds 500 µm, the mechanical properties of the magnetic elastomer layer tend to deteriorate, and the magnetic elastomer layer tends to be brittle.

The magnetic filler may be introduced into the elastomer after magnetization; however, it is preferable to magnetize the magnetic filler after introduction into the elastomer. By magnetization after introduction into the elastomer, the polarity of the magnet can be easily controlled, and the magnetic field can be easily detected.

A thermoplastic elastomer, a thermosetting elastomer, or a mixture of these can be used as the elastomer component. Examples of the thermoplastic elastomer include a styrene-based thermoplastic elastomer, a polyolefin-based thermoplastic elastomer, a polyurethane-based thermoplastic elastomer, a polyester-based thermoplastic elastomer, a polyamide-based thermoplastic elastomer, a polybutadiene-based thermoplastic elastomer, a polyisoprene-based thermoplastic elastomer, and a fluororubber-based thermoplastic elastomer. Also, examples of the thermosetting elastomer include diene-based synthetic rubbers such as polyisoprene rubber, polybutadiene rubber, styrene-butadiene rubber, polychloroprene rubber, nitrile rubber, and ethylene-propylene rubber, non-diene-based synthetic rubbers such as ethylene-propylene rubber, butyl rubber, acrylic rubber, polyurethane rubber, fluororubber, silicone rubber, and epichlorohydrin rubber, and natural rubbers. Among these, a thermosetting elastomer is preferable, and this is because settling of the magnetic elastomer accompanying the heat generation or overloading of the battery can be suppressed. Further, a polyurethane rubber (which may also be referred to as a polyurethane elastomer) or a silicone rubber (which may also be referred to as a silicone elastomer) is more preferable.

A polyurethane elastomer can be obtained by reacting a polyol with a polyisocyanate. In the case in which the polyurethane elastomer is used as the elastomer component, a magnetic filler is mixed with a compound containing active hydrogen, and further an isocyanate component is added thereto to obtain a mixture liquid. Also, a mixture liquid can also be obtained by mixing a magnetic filler with an isocyanate component, and mixing a compound containing active hydrogen thereto. The magnetic elastomer can be produced by injecting the mixture liquid into a mold that has been subjected to a releasing treatment, and thereafter heating the mixture liquid up to a curing temperature for curing. Also, in the case in which a silicone elastomer is used as the elastomer component, the magnetic elastomer can be produced by putting a magnetic filler into a precursor of a silicone elastomer, mixing the components, putting the resulting mixture into a mold, and thereafter heating the mixture for curing. A solvent may be added as necessary.

A compound known in the art in the field of polyurethane can be used as the isocyanate component that can be used in the polyurethane elastomer. Examples of the isocyanate component include aromatic diisocyanates such as 2,4-toluene diisocyanate, 2,6-toluene diisocyanate, 2,2'-diphenylmethane diisocyanate, 2,4'-diphenylmethane diisocyanate, 4,4'-diphenylmethane diisocyanate, 1,5-naphthalene diisocyanate, p-phenylene diisocyanate, m-phenylene diisocyanate, p-xylylene diisocyanate, and m-xylylene diisocyanate, aliphatic diisocyanates such as ethylene diisocyanate, 2,2,4-trimethylhexamethylene diisocyanate, and 1,6-hexamethylene diisocyanate, and alicyclic diisocyanates such as 1,4-cyclohexane diisocyanate, 4,4'-dicyclohexylmethane diisocyanate, isophorone diisocyanate, and norbornane diisocyanate. These may be used either alone or as a mixture of two or more kinds. Also, the isocyanate component may be a modified component such as a urethane-modified, allophanate-modified, biuret-modified, or isocyanurate-modified component. Preferable isocyanate components are 2,4-toluene diisocyanate, 2,6-toluene diisocyanate, and 4,4'-diphenylmethane diisocyanate.

A compound typically used in the technical field of polyurethane can be used as the compound containing active hydrogen. Examples of the compound containing active hydrogen include high-molecular-weight polyols such as polyether polyols represented by polytetramethylene glycol, polypropylene glycol, polyethylene glycol, and a copolymer of propylene oxide and ethylene oxide, polyester polyols represented by polybutylene adipate, polyethylene adipate, and 3-methyl-1,5-pentane adipate, polyester polycarbonate polyols typified by reaction products of alkylene carbonate and polyester glycol such as polycaprolactone polyol or polycaprolactone, polyester polycarbonate polyols obtained by reacting ethylene carbonate with a polyhydric alcohol and subsequently reacting the obtained reaction mixture with an organic dicarboxylic acid, and polycarbonate polyols obtained by transesterification reaction of a polyhydroxyl compound and aryl carbonate. These may be used either alone or as a mixture of two or more kinds.

In addition to the above-described high-molecular-weight polyol components, low-molecular-weight polyol components such as ethylene glycol, 1,2-propylene glycol, 1,3-propylene glycol, 1,4-butanediol, 1,6-hexanediol, neopentyl glycol, 1,4-cyclohexanedimethanol, 3-methyl-1,5-pentanediol, diethylene glycol, triethylene glycol, 1,4-bis(2-hydroxyethoxy)benzene, trimethylolpropane, glycerin, 1,2,6-hexanetriol, pentaerythritol, tetramethylolcyclohexane, methylglucoside, sorbitol, mannitol, dulcitol, sucrose, 2,2,6,6-tetrakis(hydroxymethyl)cyclohexanol, and triethanolamine, and low-molecular-weight polyamine components such as ethylenediamine, tolylenediamine, diphenylmethanediamine, and diethylenetriamine may be used as the compound containing active hydrogen. These may be used either alone or as a mixture of two or more kinds. Further, polyamines typified by 4,4'-methylenebis(o-chloroaniline) (MOCA), 2,6-dichloro-p-phenylenediamine, 4,4'-methylenebis(2,3-dichloroaniline), 3,5-bis(methylthio)-2,4-toluenediamine, 3,5-bis(methylthio)-2,6-toluenediamine, 3,5-diethyltoluene-2,4-diamine, 3,5-diethyltoluene-2,6-diamine, trimethyleneglycol-di-p-aminobenzoate, polytetramethyleneoxide-di-p-aminobenzoate, 1,2-bis(2-aminophenylthio)ethane, 4,4'-diamino-3,3'-diethyl-5,5'-dimethyldiphenylmethane, N,N'-di-sec-butyl-4,4'-diaminodiphenylmethane, 4,4'-diamino-3,3'-diethyldiphenylmethane, 4,4'-diamine-3,3'-diethyl-5,5'-dimethyldiphenylmethane, 4,4'-diamino-3,3'-diisopropyl-5,5'-dimethyldiphenylmethane, 4,4'-diamino-3,3',5,5'-tetraethyldiphenylmethane, 4,4'-diamino-3,3',5,5'-tetraisopropyldiphenylmethane, m-xylylenediamine, N,N'-di-sec-butyl-p-phenylenediamine, m-phenylenediamine, and p-xylylenediamine may also be mixed. Preferable compounds containing active hydrogen are polytetramethylene glycol, polypropylene glycol, a copolymer of propylene oxide and ethylene oxide, and a polyester polyol made of 3-methyl-1,5-pentanediol and adipic acid. More preferable compounds containing active hydrogen are polypropylene glycol and a copolymer of propylene oxide and ethylene oxide.

A preferable combination of the isocyanate component and the compound containing active hydrogen is a combination of one kind or two more kinds of 2,4-toluene diisocyanate, 2,6-toluene diisocyanate, and 4,4'-diphenylmethane diisocyanate as the isocyanate component and one kind or two more kinds of polytetramethylene glycol, polypropylene glycol, a copolymer of propylene oxide and ethylene oxide, and 3-methyl-1,5-pentane adipate as the compound containing active hydrogen. A more preferable combination is a combination of 2,4-toluene diisocyanate and/or 2,6-toluene diisocyanate as the isocyanate component and polypropylene glycol and/or a copolymer of propylene oxide and ethylene oxide as the compound containing active hydrogen.

A known catalyst can be used without limitation as the catalyst to be used in the polyurethane elastomer; however, a tertiary amine catalyst such as triethylenediamine (1,4-diazabicyclo[2,2,2]octane), N,N,N',N'-tetramethylhexanediamine, or bis(2-dimethylaminoethyl)ether is preferably used, and a metal catalyst such as tin octylate or lead octylate can also be used in combination.

Commercially available products of the catalysts include "TEDA-L33" manufactured by Tosoh Corporation, "NIAX CATALYST A1" manufactured by Momentive Performance Materials Inc., "KAOLXZER NO. 1" and "KAOLIZER NO. 30P" manufactured by Kao Corporation, "DABCO T-9" manufactured by Air Products and Chemicals, Inc., and "BTT-24" manufactured by Toei Chemical Industry Co., Ltd.

The amount of the magnetic filler in the magnetic elastomer is preferably 1 to 450 parts by weight, more preferably 2 to 400 parts by weight, relative to 100 parts by weight of the elastomer component. When the amount is smaller than 1 part by weight, detection of change in the magnetic field tends to be difficult. When the amount exceeds 450 parts by weight, the magnetic elastomer itself may in some cases become brittle.

As the detection unit 4 for detecting change in the magnetic field, a magnetic resistance element, a Hall element, an inductor, an MI element, a flux gate sensor, or the like can be used, for example. As the magnetic resistance element, a semiconductor compound magnetic resistance element, an anisotropic magnetic resistance element (AMR), a gigantic magnetic resistance element (GMR), and a tunnel magnetic resistance element (TMR) may be mentioned as examples. Among these, a Hall element is preferable, and this is because the Hall element has high sensitivity in a wide range, and is useful as the detection unit 4.

The elastic modulus of the polymer matrix layer 3 is preferably from 0.01 to 10 MPa, more preferably from 0.02 to 8 MPa, still more preferably from 0.03 to 6 MPa, and further more preferably from 0.05 to 5 MPa. When the elastic modulus is smaller than 0.01 MPa, the handling property of the polymer matrix layer 3 is deteriorated to make the handling difficult. Also, when the elastic modulus is larger than 10 MPa, the polymer matrix layer 3 becomes less likely to be deformed, so that the sensor sensitivity tends to decrease. A method for obtaining an elastic modulus within a range from 0.01 to 10 MPa may be, for example, addition of a plasticizer, addition of a monool component, or adjustment of an NCO index.

The polymer matrix layer 3 is formed, for example, in a sheet form, and the thickness thereof is preferably from 300 to 3000 μm, more preferably from 400 to 2000 μm, and still more preferably from 500 to 1500 μm. When the thickness is smaller than 300 μm, the polymer matrix layer 3 tends to become brittle when a required amount of the filler is added, thereby the handling property is deteriorated. On the other hand, when the thickness is larger than 3000 μm, it may in some cases become difficult to dispose the polymer matrix layer 3 in the inside of the outer casing 21, though this depends on the size of the inside space of the cell 2.

Figure 2:
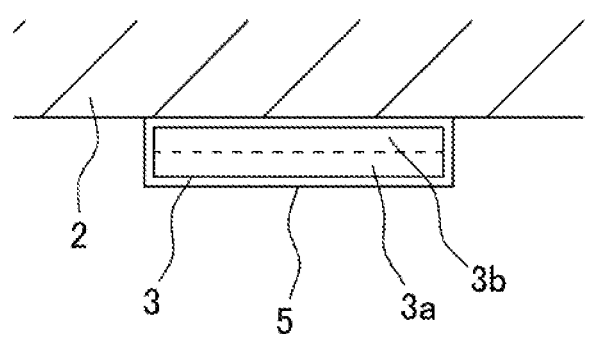
FIG. 2 is an enlarged view illustrating a site where a polymer matrix layer is attached.
Figure 3:
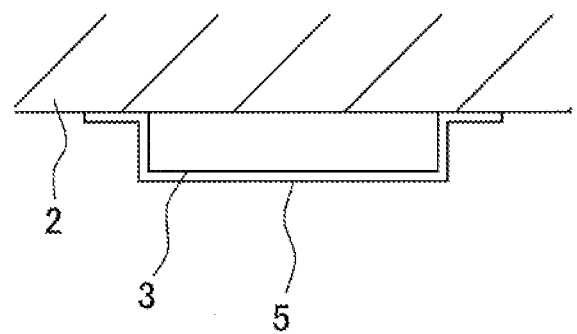
FIG. 3 is an enlarged view illustrating another example of attaching a polymer matrix layer.

As illustrated in FIG. 2, the polymer matrix layer 3 is covered with a protective film 5 for preventing elution into the electrolytic solution. This allows that the sensor sensitivity can be ensured successfully without elution of the polymer matrix layer 3 into the electrolytic solution. The protective film 5 is formed of a material that is not eluted into the electrolytic solution, and specific examples of the material include thermoplastic resins such as styrene-based thermoplastic elastomer, polyolefin-based thermoplastic elastomer, polyurethane-based thermoplastic elastomer, polyester-based thermoplastic elastomer, polyamide-based thermoplastic elastomer, polybutadiene-based thermoplastic elastomer, polyisoprene-based thermoplastic elastomer, fluorine-based thermoplastic elastomer, ethylene-ethyl acrylate copolymer, ethylene-vinyl acetate copolymer, polyvinyl acetate, polyvinyl chloride, polyvinylidene chloride, chlorinated polyethylene, fluororesin, polyamide, polyamideimide, polyethylene, polypropylene, polyethylene terephthalate, polybutylene terephthalate, polystyrene, polybutadiene, polyacrylic acid, sodium polyacrylate, and polyvinyl alcohol, diene-based synthetic rubbers such as polyisoprene rubber, polybutadiene rubber, styrene-butadiene rubber, polychloroprene rubber, and acrylonitrile-butadiene rubber, non-diene-based rubbers such as ethylene-propylene rubber, ethylene-propylene-diene rubber, butyl rubber, acrylic rubber, polyurethane rubber, fluorine-containing rubber, silicone rubber, and epichlorohydrin rubber, natural rubbers, and thermosetting resins such as polyurethane resin, silicone resin, and epoxy resin. These films may be stacked or may be a film including a metal foil such as aluminum foil or a metal vapor-deposition film including a metal vapor-deposited on the above-described film. Also, the present embodiment is not limited to a structure in which the surface of the polymer matrix layer 3 is entirely covered with the protective film 5, so that it is possible to adopt a structure in which only the part that is in the surface of the polymer matrix layer 3 and that faces the inside space of the cell 2 is covered with the protective film 5, as illustrated in FIG. 3.

In the polymer matrix layer 3 (magnetic elastomer layer in the present embodiment), it is preferable that the filler (magnetic filler in the present embodiment) is unevenly distributed in the thickness direction thereof, and a region 3a that is located on one side and that contains a relatively larger amount of the filler is directed toward the electrode group 22. In the region 3a that is located on the one side and that contains a larger amount of the filler, a large change in the external field results from small deformation of the polymer matrix layer 3, so that the sensor sensitivity to a low internal pressure can be enhanced. Also, a region 3b that is located on the other side and that contains a relatively smaller amount of the filler is comparatively flexible and can be easily moved. Therefore, by attaching this region 3b located on the other side to the inner surface of the outer casing 21, the polymer matrix layer 3 (particularly the region 3a located on the one side) becomes capable of being easily deformed.

In the above, the filler uneven distribution ratio in the region 3a on the one side preferably exceeds 50, and is more preferably 60 or more, still more preferably 70 or more. In this case, the filler uneven distribution ratio in the region 3b on the other side is less than 50. The filler uneven distribution ratio in the region 3a on the one side is 100 at the maximum, and the filler uneven distribution ratio in the region 3b on the other side is 0 at the minimum. Therefore, if is possible to adopt a stacked body structure including an elastomer layer that contains a filler and an elastomer layer that does not contain the filler. For uneven distribution of the filler, it is possible to use a method in which, after the filler is introduced into the elastomer component, the resultant is left to stand still at room temperature or at a predetermined temperature, so as to attain natural settling of the filler by the weight of the filler. By changing the temperature or time for leaving the filler to stand still, the filler uneven distribution ratio can be adjusted. The filler may be distributed unevenly by using a physical force such as a centrifugal force or a magnetic force. Alternatively, the polymer matrix layer may be composed of a stacked body made of a plurality of layers having different contents of the filler.

The filler uneven distribution ratio is measured by the following method. That is, the cross-section of the polymer matrix layer is observed at a magnification of 100 times by using a scanning electron microscope—energy dispersive X-ray analyzer (SEM-EDS). The existence amount of the metal element inherent in the filler (for example, Fe element in the magnetic filler of the present embodiment) is determined by element analysis for the whole region in the thickness direction of the cross-section and for each of the two regions obtained by equally dividing the cross-section into two in the thickness direction. With respect to this existence amount, the ratio of the existence amount in the region on the one side relative to the existence amount in the whole region in the thickness direction is calculated, and this is determined as the filler uneven distribution ratio in the region on the one side. The filler uneven distribution ratio in the region on the other side can be determined in the same manner.

The polymer matrix layer 3 may have a structure in which the region 3b that is located on the other side and that contains a relatively smaller amount of the filler is formed of a foamed body containing bubbles. This allows that the polymer matrix layer 3 can be more easily deformed, so that the sensor sensitivity is enhanced. Also, the region 3a as well as the region 3b may be formed of a foamed body. In this case, the whole of the polymer matrix layer 3 is made of a foamed body. The polymer matrix layer in which at least a part thereof in the thickness direction is made of a foamed body may be composed of a stacked body including a plurality of layers (for example, a non-foamed layer that contains a filler and a foamed layer that does not contain a filler).

A general resin foam can be used as the foamed body. However, in view of the characteristics such as compression set, it is preferable to use a thermosetting resin foam. Examples of the thermosetting resin foam include polyurethane resin foam and silicone resin foam. Among these, polyurethane resin foam is preferable. The isocyanate component and the compound containing active hydrogen that have been listed above can be used for the polyurethane resin foam. The polyurethane resin foam can be produced by an ordinary method of producing a polyurethane resin foam except that the magnetic filler is incorporated. The isocyanate component, the compound containing active hydrogen, and the catalyst that have been listed above can be used for the polyurethane resin foam.

As a foam stabilizer to be used in the polyurethane resin foam, it is possible to use a foam stabilizer that is used in producing an ordinary polyurethane resin foam, such as a silicone-based foam stabilizer or a fluorine-based foam stabilizer. A silicone-based surfactant or a fluorine-based surfactant that is used in the silicone-based foam stabilizer or fluorine-based foam stabilizer has a part that is soluble in polyurethane and a part that is insoluble in polyurethane in a molecule. Because the insoluble part disperses the polyurethane-based material uniformly to reduce the surface tension of the polyurethane-based material, the bubbles are more easily generated and are less likely to be broken. Of course, when the surface tension is lowered too much, the bubbles are less likely to be generated. When, for example, the silicone-based surfactant is used in the resin foam of the present invention, a dimethylpolysiloxane structure serving as the insoluble part makes it possible to reduce the bubble diameter or to increase the number of bubbles.

Commercially available products of the silicone-based foam stabilizers include "SF-2962," "SRX 274DL," "SF-2965," "SF-2904," "SF-2908," "SF-2904," and "L5340" manufactured by Dow Corning Toray Co., Ltd., and "TEGOSTAB B-8017," "B-8465," and "B-8443" manufactured by Evonik-Degussa AG. Also, commercially available products of the fluorine-based foam stabilizers include "FC430" and "FC4430" manufactured by 3M Company, and "FC142D," "F552," "F554," "F558," "F561," and "R41" manufactured by Dainippon Ink and Chemicals, Incorporated.

The amount of the foam stabilizer blended is preferably from 1 to 15 parts by mass, more preferably from 2 to 12 parts by mass, relative to 100 parts by mass of the resin component. When the amount of the foam stabilizer blended is less than 1 part by mass, the foaming is insufficient. When the amount of the foam stabilizer blended exceeds 10 parts by mass, there is a possibility of bleeding out.

The bubble content ratio of the foamed body is preferably from 20 to 80 vol %. When the bubble content ratio is 20 vol % or more, the polymer matrix layer 3 becomes flexible and can be easily deformed, whereby the sensor sensitivity can be enhanced successfully. Also, when the bubble content ratio is 80 vol % or less, the polymer matrix layer 3 is prevented from becoming brittle, so that the handling property and the stability of the sensor can be enhanced. The bubble content ratio can be determined by performing specific gravity measurement in accordance with JIS Z-8807-1976, and performing calculation based on the measured specific gravity value and the specific gravity value of a non-foamed body.

The average bubble diameter of the foamed body is preferably from 50 to 300 μm. Also, the average opening diameter of the foamed body thereof is preferably from 15 to 100 μm. When the average bubble diameter is less than 50 μm or when the average opening diameter is less than 15 μm, the stability of the sensor characteristics tends to be deteriorated due to increase in the amount of the foam stabilizer. Also, when the average bubble diameter exceeds 300 μm or when the average opening diameter exceeds 100 μm, the stability of the sensor characteristics tends to decrease due to variation in the bubble diameter. The average bubble diameter and the average opening diameter can be determined as follows. A cross-section of the polymer matrix layer is observed with a SEM at a magnification of 100 times. With respect to the obtained image, bubble diameters of all the bubbles and opening diameters of ail the open-cell bubbles that are present in an arbitrary range of the cross-section are measured using image analyzing software. The average bubble diameter and the average opening diameter are calculated based on the average values of the measured values.

The polyurethane resin foam described above can be produced by an ordinary method of producing a polyurethane resin foam. Also, when the polyurethane resin foam contains a magnetic filler, a production method including the following steps (i) to (v) is used, for example.

(i) Step of forming an isocyanate-group-containing urethane prepolymer from a polyisocyanate component and an active hydrogen component.

(ii) Primary stirring step of mixing and preliminarily stirring the isocyanate-group-containing urethane prepolymer, a foam stabilizer, a catalyst, and a magnetic filler, and vigorously stirring the mixture in a non-reactive gas atmosphere so as to incorporate bubbles into the mixture (iii) Step of further adding an active hydrogen component and performing secondary stirring to prepare a bubble dispersion urethane composition containing the magnetic filler (iv) Step of molding the bubble dispersion urethane composition into a desired shape and curing the composition to fabricate a urethane resin foam containing the magnetic filler (v) Step of magnetizing the urethane resin foam to form a magnetic urethane resin foam As a method for producing a polyurethane resin foam, a chemical foaming method using a reactive foaming agent such as water is known. However, it is preferable to use a mechanical foaming method of mechanically stirring the mixture under a non-reactive gas atmosphere as in the above step (ii). The mechanical foaming method facilitates the molding operation as compared with the chemical foaming method. Also, because water is not used as the foaming agent, a molded body having fine bubbles and being tough and excellent in repulsion elasticity (restorability) and the like can be obtained.

First, an isocyanate-group-containing urethane prepolymer is formed from a polyisocyanate component and an active hydrogen component, as described in the above step (i). Next, the isocyanate-group-containing urethane prepolymer, a foam stabilizer, a catalyst, and a magnetic filler are mixed and preliminarily stirred, and the mixture is vigorously stirred in a non-reactive gas atmosphere so as to incorporate bubbles into the mixture, as described in the above step (ii), and an active hydrogen component is further added and stirred to prepare a bubble dispersion urethane composition containing the magnetic filler, as described in the above step (iii). As described in the above steps (i) to (iii), in a polyurethane resin foam containing a polyisocyanate component, an active hydrogen component, and a catalyst, a method of forming the polyurethane resin foam after preliminarily forming an isocyanate-group-containing urethane prepolymer is known to those skilled in the art, and the production conditions can be suitably selected in accordance with the materials to be blended.

As the forming conditions in the above step (i), first, a blending ratio of the polyisocyanate component to the active hydrogen component is selected so that the ratio of the isocyanate group in the polyisocyanate component to the active hydrogen group in the active hydrogen component (isocyanate group/active hydrogen group) will be from 1.5 to 5, preferably from 1.7 to 2.3. Also, the reaction temperature is preferably from 60 to 120° C., and the reaction time is preferably from 3 to 8 hours. Further, a urethanization catalyst or an organic catalyst conventionally known in the art, for example, lead octylate commercially available under a trade name of "BTT-24" from Toei Chemical Industry Co., Ltd., "TEDA-L33" manufactured by Tosoh Corporation, "NIAX CATALYST A1" manufactured by Momentive Performance Materials Inc., "KAOLIZER NO. 1" manufactured by Kao Corporation, "DABCO T-9" manufactured by Air Products and Chemicals, Inc., or the like may be used. As an apparatus to be used in the above step (i), one capable of mixing and stirring the above materials and reacting the materials under the conditions as described above can be used, and an apparatus generally used for production of polyurethane can be used.

As a method for performing the preliminary stirring in the above step (ii), there can be mentioned a method of using a general mixer that can mix a liquid resin with a filler, and examples thereof include a homogenizer, a dissolver, and a planetary mixer.

By adding the foam stabilizer to the isocyanate-group-containing urethane prepolymer having a high viscosity and performing the stirring (primary stirring) in the above step (ii), and further adding the active hydrogen component and performing the secondary stirring in the above step (iii), the bubbles that have been incorporated into the reaction system become less likely to escape, so that an efficient foaming operation can be advantageously carried out.

The non-reactive gas in the above step (ii) is preferably a gas that is not combustible, and specific examples thereof include nitrogen, oxygen, carbon dioxide, rare gases such, as helium and argon, and a mixed gas of these. Use of air that has been dried to remove moisture therefrom is the most preferable. Also, with respect to the conditions for the above primary stirring and secondary stirring, particularly for the primary stirring, conditions in producing a urethane foam by an ordinary mechanical foaming method can be used, so that the conditions are not particularly limited; however, vigorous stirring is carried out for 1 to 30 minutes at a rotation number of 1000 to 10000 rpm by using a stirring blade or a mixer having a stirring blade. Examples of such an apparatus include a homogenizer, a dissolver, and a mechanical froth foaming machine.

A method of molding the bubble dispersion urethane composition, into a desired shape such as a sheet form in the above step (iv) is also not particularly limited. For example, it is possible to use a batch molding method in which the above mixture liquid is injected into a mold that has been subjected to a releasing treatment and cured, or a continuous molding method in which the above bubble dispersion, urethane composition is continuously supplied onto a face material that has been subjected to a releasing treatment and cured. Also, the above curing conditions are not particularly limited, and curing at 60 to 200° C. for 10 minutes to 24 hours is preferable. When the curing temperature is too high, the resin foam is deteriorated by heat, thereby the mechanical strength is deteriorated. When the curing temperature is too low, the resin foam is insufficiently cured. Also, when the curing time is too long, the resin foam is deteriorated by heat, thereby the mechanical strength is deteriorated. When the curing time is too short, the resin foam is insufficiently cured.

Also, in the above step (iv), by providing a step of leaving the bubble dispersion urethane composition to stand still prior to curing, settling of the magnetic filler proceeds and floating-up of the bubbles proceeds in accordance with the period of time for leaving the filler to stand still. Therefore, by utilizing this phenomenon, a state can be obtained in which the magnetic filler is unevenly distributed in the thickness direction, and bubbles are present in a larger amount on the side that contains a relatively smaller amount of the magnetic filler.

In the above step (v), a method of magnetizing the magnetic filler is not particularly limited, so that the magnetization can be carried out by using a magnetizing apparatus that is generally used, for example, "ES-10100-15SH" manufactured by Denshijiki Industry Co., Ltd., or "TM-YS4E" manufactured by Tamakawa Co., Ltd. Typically, a magnetic field having a magnetic flux density of 1 to 3 T is applied. The magnetic filler may be added, after magnetization, in the above step (ii) of forming the magnetic filler dispersion liquid. However, it is preferable to perform the magnetization in the above step (v) in view of the handling workability of the magnetic filler in the midway steps, for example.

In the present embodiment, the polymer matrix layer 3 is attached to the inner surface of the outer casing 21 and is disposed to be distant from the electrode group 22. Such attaching of the polymer matrix layer 3 is comparatively easy and can be easily stabilized, thereby being excellent in productivity and stability of the sensor. A construction in which the filler is unevenly distributed in the above-described manner allows that, by attaching the comparatively flexible region 3b located on the other side to the inner surface of the outer casing 21, the region 3a located on the one side can be easily moved, thereby effectively enhancing the sensor sensitivity. For attaching of the polymer matrix layer 3, an adhesive agent or an adhesive tape is used as necessary.

Figure 4:
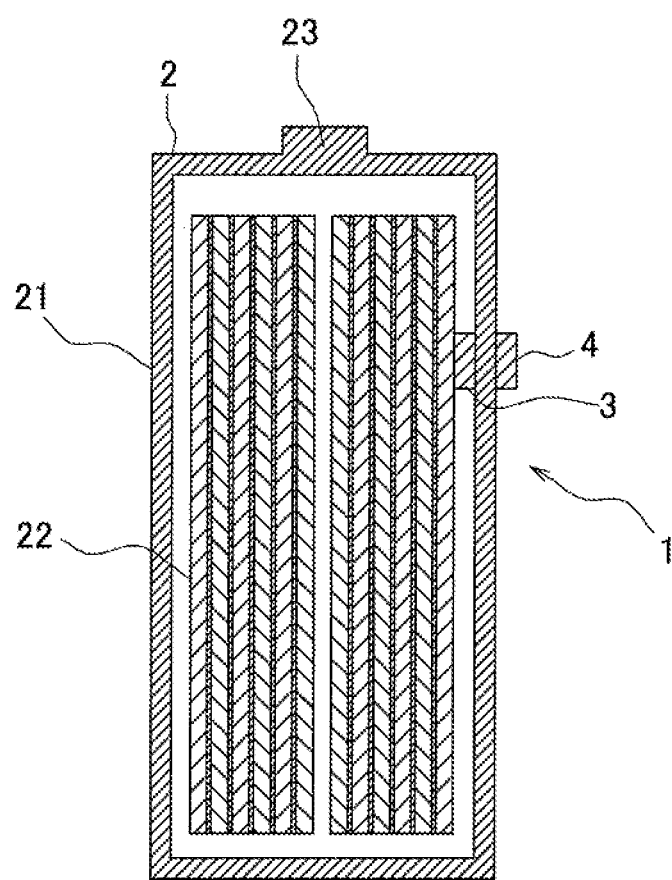
FIG. 4 is a sectional view illustrating another example of attaching a polymer matrix layer.

As illustrated in FIG. 4, the polymer matrix layer 3 may be attached to the electrode group 22. This allows that the electrode swelling accompanying the charging and discharging can be detected. In this case, when the electrode group 22 is expanded and deformed by volume change of the active substance accompanying the charging and discharging, the polymer matrix layer 3 is deformed in accordance therewith, and change in the external field accompanying the deformation of the polymer matrix layer 3 is detected by the detection unit 4. The polymer matrix layer 3 can be deformed also in accordance with the expansion of the electrode group 22 constituting the cause of the swelling of the outer casing 21, so that the electrode swelling of the cell 2 can be detected with a high degree of sensitivity. Detection signals that are output from the detection unit 4 are forwarded to a controlling apparatus not illustrated in the drawings, so as to monitor the inside state of the cell 2 over time.

Figure 5:
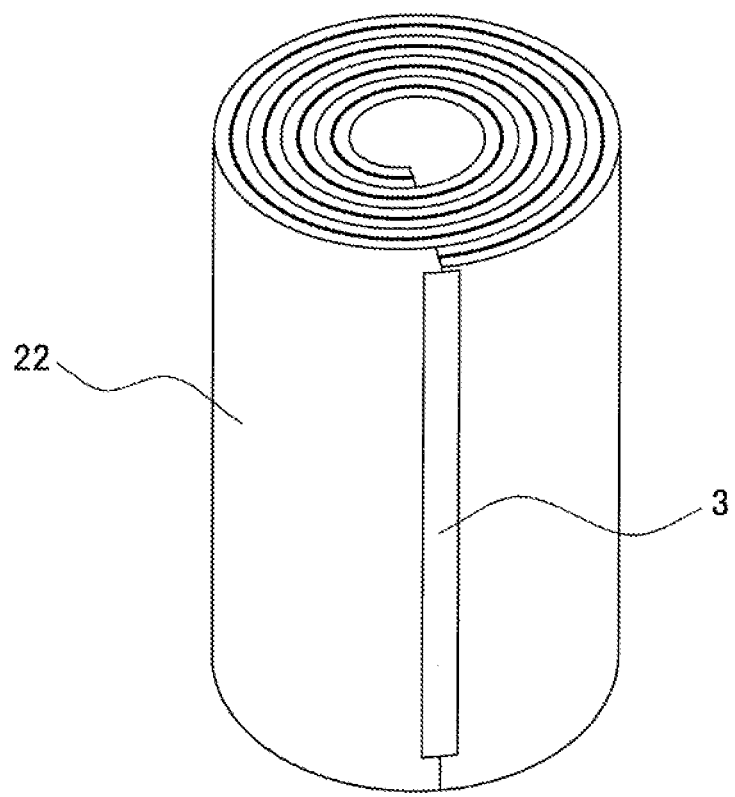
FIG. 5 is a perspective view illustrating another example of attaching a polymer matrix layer.

The site for attaching the polymer matrix layer 3 is not particularly limited as long as the site is located in the inside of the outer casing 21. In the present embodiment, the polymer matrix layer 3 is attached to the inner surface located in an upper part, in FIG. 1; however, the polymer matrix layer 3 may be attached to the inner surface located in a lower part or to the inner surface located in a side part. Alternatively, the polymer matrix layer 3 may be attached to a surface of the electrode group 22 or may be disposed to be sandwiched between the electrode groups 22, as described above. The polymer matrix layer 3 may also be attached, in a folded state, to a corner part of the outer casing 21 or the electrode group 22. In the case in which the polymer matrix layer 3 is attached to a surface of the electrode group having a wound structure, use of the polymer matrix layer 3 as a tape for holding the terminal end of the electrode group 22 may also be considered, as illustrated in FIG. 5.

As another method for attaching the polymer matrix layer 3 to the outer casing 21, there can be considered a method of disposing a shaping container in the inside of the outer casing 21 and injecting the thermosetting elastomer, which contains the magnetic filler and which has not been cured yet, into at least a part of the gap between the outer casing 21 and the shaping container, followed by curing. After the polymer matrix layer 3 is formed, the shaping container is removed, and the outer casing 21 to which the polymer matrix layer 3 has been attached is subjected to production of the cell 2. When the electrode group 22 is disposed in the inside of the shaping container, the polymer matrix layer 3 can be attached to the electrode group 22 as illustrated in FIG. 4, in the same manner as described above.

The detection unit 4 is preferably attached to a comparatively firm site that is hardly affected by the swelling of the cell 2 and, above all, it is advantageous to mount the detection unit 4 onto an outer surface of the outer casing 21. In the present embodiment, the polymer matrix layer 3 and the detection unit 4 face each other with the outer casing 21 interposed therebetween. However, the present invention is not limited to this form alone, so that the detection unit 4 may be attached to another member such as a case of a battery module or a case of a battery pack, as will be described later. These cases are formed, for example, of a metal or a plastic.

The secondary battery 1 of the present embodiment is a lithium ion secondary battery and, for use that requires a high voltage, the secondary battery 1 is used in a form of a battery module or a battery pack that includes a plurality of cells 2. In the battery module, a plurality of cells connected in series are accommodated in a case. In the battery pack, a plurality of battery modules connected in series are accommodated in a case. The secondary battery on which the monitoring sensor according to the present invention is mounted is not limited to a non-aqueous electrolyte secondary battery such as a lithium ion battery, but may be an aqueous electrolyte secondary battery such as a nickel hydrogen battery or a lead storage battery.

A method for monitoring the inside state of the secondary battery 1 by using the above-described monitoring sensor is as already described. That is, when an internal pressure of the cell 2 rises due to decomposition of the electrolytic solution or the like caused by overcharging, or the electrode swelling accompanying the charging and discharging increases, and the polymer matrix layer 3 is deformed in accordance therewith, change in the external field accompanying the deformation of the polymer matrix layer 3 is detected by the detection unit 4, and the internal pressure change or the electrode swelling of the secondary battery 1 is detected on the basis thereof.

The present invention is not limited to the embodiment mentioned above, but can be improved and modified variously within the scope of the present invention. For example, in the above-described embodiment, an example in which change in the magnetic field is used has been shown; however, a construction in which change in another external field is used may likewise be adopted.

EXAMPLES

Hereinafter, Examples of the present invention will be described; however, the present invention is not limited to these alone.

The following source materials were used for production of a magnetic polyurethane resin (one of magnetic elastomers containing a polyurethane elastomer as an elastomer component) that forms the polymer matrix layer.

p-MDI: diphenylmethane diisocyanate (manufactured by Nippon Polyurethane Industry Co., Ltd., MILLIONATE MTL)

Polyol A: polyoxypropylene glycol obtained by adding propylene oxide to glycerin as an initiator, hydroxyl value of 56, number of functional groups being 3 (manufactured by Asahi Glass Co., Ltd., EX-3030)

Polyol B: polyoxypropylene glycol obtained by adding propylene oxide to propylene glycol as an initiator, hydroxyl value of 56, number of functional groups being 2 (manufactured by Asahi Glass Co., Ltd., EX-2020)

Polyol C: polyoxypropylene glycol obtained by adding propylene oxide to trimethylolpropane as an initiator, hydroxyl value of 865, number of functional groups being 3 (manufactured by Asahi Glass Co., Ltd., EX-890MP)

Neodymium-based filler: MF-15P (average particle size of 133 μm, manufactured by Aichi Steel Corporation)

Neodymium-based filler: ME-15P (average particle size of 33 μm, manufactured by Aichi Steel Corporation)

Bismuth octylate: PUCAT 25 (Bi 25%, manufactured by Nihon Kagaku Sangyo Co., Ltd.)

Tin octylate: NIKKA OCTHIX TIN (Sn 28%, manufactured by Nihon Kagaku Sangyo Co., Ltd.)

Also, the prepolymer A shown in Table 1 was used as the prepolymer.

TABLE 1

| Prepolymer A | p-MDI | NCO % = 33.6% | 20.0 |
|---|---|---|---|
| | Polyol A | OHV = 56 | 40.0 |
| | Polyol B | OHV = 56 | 40.0 |
| | | NCO % | 3.36 |

Example 1

Into a reaction container, 40.0 parts by weight, of the polyol A (polyoxypropylene glycol obtained by adding propylene oxide to glycerin as an initiator, hydroxyl value of 56, number of functional groups being 3, manufactured by Asahi Glass Co., Ltd., EX-3030) and 40.0 parts by weight of the polyol B (polyoxypropylene glycol obtained by adding propylene oxide to propylene glycol as an initiator, hydroxyl value of 56, number of functional groups being 2, manufactured by Asahi Glass Co., Ltd., EX-2020) were put, and vacuum-dehydrated while being stirred for 1 hour. Thereafter, the inside of the reaction container was replaced with nitrogen. Subsequently, 20.0 parts by weight of p-MDI (diphenylmethane diisocyanate, manufactured by Nippon Polyurethane Industry Co., Ltd., MILLIONATE MTL) was added into the reaction container. While keeping the temperature of the inside of the reaction container at 80° C., the reaction was carried out for 3 hours to synthesize an isocyanate-terminated prepolymer A (NCO %=3.36%).

Next, 390.0 parts by weight of a neodymium-based filler (manufactured by Aichi Steel Corporation, MF-15P, average particle size of 133 μm) was added into a mixture liquid of 100.0 parts by weight of the prepolymer A and 0.60 part by weight of bismuth octylate (PUCAT 25, manufactured by Nihon Kagaku Sangyo Co., Ltd.), so as to prepare a filler dispersion liquid. This filler dispersion liquid was subjected to vacuum defoaming, and 160.0 parts by weight of the above polyol A which had been subjected to vacuum defoaming in a similar manner was added. By using a rotation revolution mixer (manufactured by Thinky Corporation), mixing and defoaming were carried out, so as to prepare a urethane composition containing the magnetic filler. The urethane composition was dropped onto a PET film which had been subjected to a releasing treatment and which had a spacer of 1.0 mm, and the resultant was adjusted to have a thickness of 1.0 mm with use of a nip roll. Thereafter, the resultant was left to stand still at room temperature for a predetermined period of time (uneven distribution treatment time), and curing was carried out at 80° C. for 1 hour, so as to obtain a polyurethane resin containing the magnetic filler. The obtained polyurethane resin was magnetized at 2.0 T with use of a magnetizing apparatus (manufactured by Denshijiki Industry Co., Ltd.) to obtain a magnetic polyurethane resin. The blended components and production conditions are shown in Table 2.

Examples 2 to 7

Magnetic polyurethane resins were obtained in the same manner as in Example 1 on the basis of the blended components and production conditions shown in Table 2.

Example 8

A filler dispersion liquid was prepared by adding 476.0 parts by weight of a neodymium-based filler (manufactured by Aichi Steel Corporation, MF-15P, average particle size of 133 μm) into a mixture liquid of 100.0 parts by weight of the above prepolymer A, 5.0 parts by weight of a silicone-based foam stabilizer (manufactured by Dow Corning Toray Co., Ltd., L-5340), and 0.42 part by weight of bismuth octylate (manufactured by Nippon Chemical Industrial Co., Ltd., BTT-24). This filler dispersion liquid was subjected to vigorous primary stirring for 5 minutes so as to take bubbles into the reaction system by using a stirring blade at a rotation number of 1000 rpm. Thereafter, 80.0 parts by weight of the above polyol A was added, and the resultant was subjected to secondary stirring for 3 minutes to prepare a bubble dispersion urethane composition containing the magnetic filler.

The above bubble dispersion urethane composition was dropped onto a PET film which had been subjected to a releasing treatment and which had a spacer of 1.0 mm, and the resultant was adjusted to have a thickness of 1.0 mm with use of a nip roll. Thereafter, curing was carried out at 80° C. for 1 hour, so as to obtain a polyurethane foam containing the magnetic filler. The obtained foam was magnetized at 2.0 T with use of a magnetizing apparatus (manufactured by Denshijiki Industry Co., Ltd.) to obtain a magnetic polyurethane resin foam. This magnetic polyurethane resin foam had a bubble content ratio of 36.2 vol % and an average bubble diameter of 124 µm. The blended components and production conditions are shown in Table 2.

the whole region in the thickness direction of the cross-section and for each of the two regions obtained by equally dividing the cross-section into two in the thickness direction. With respect to this existence amount, the ratio of the existence amount in the region on the side opposite to the detection unit (the region on the lower side in FIG. 6, the region that is directed toward the electrode group in the case of the inside of the outer casing) relative to the existence amount in the whole region in the thickness direction was calculated.

(Evaluation of Sensor Characteristics)

Figure 6:
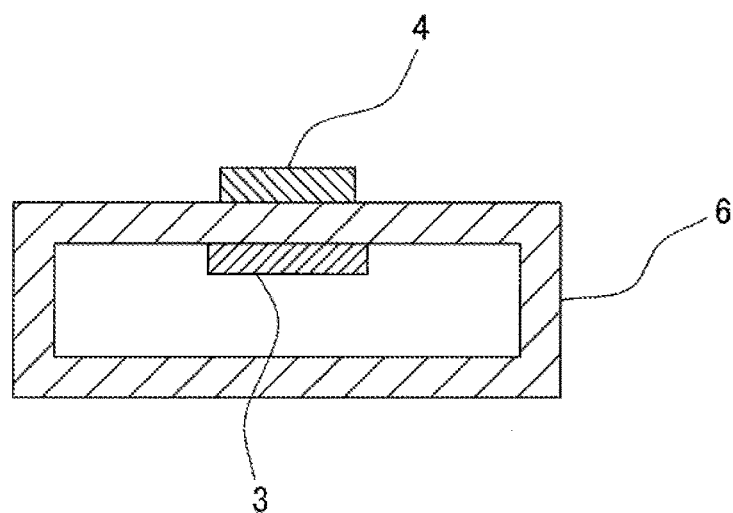
FIG. 6 is a sectional view schematically illustrating a structured article used in a test.

The fabricated magnetic polyurethane resin was cut out to have a size of 10 mm×10 mm, and this was mounted on an inner surface of a container 6 made of stainless steel as shown in FIG. 6. As the detection unit 4, a Hall element (manufactured by Asahi Kasei Microdevices Corporation, EQ-430L) was used and mounted on the outer surface of the container 6. A pressure of 0.3 MPa was applied to the inside of this container 6, and change in the magnetic flux density from the time at which no pressure was applied was detected by the detection unit 4. An average of the results obtained by performing this test five times was calculated. The larger the value of change in the magnetic flux density is, the higher the sensor sensitivity is, thereby being more excellent in the sensor characteristics. The results are shown in Table 2.

TABLE 2

| | | | Example 1 | Example 2 | Example 3 | Example 4 | Example 5 | Example 6 | Example 7 | Example 8 |
|---|---|---|---|---|---|---|---|---|---|---|
| Blended components | Prepolymer | Prepolymer A | 100.0 | 100.0 | 100.0 | 100.0 | 100.0 | 100.0 | 100.0 | 100.0 |
| | Curing agent | Polyol A | 160.0 | 200.0 | — | 200.0 | — | — | 160.0 | 80.0 |
| | | Polyol C | — | — | 5.2 | — | 5.2 | 5.2 | — | — |
| | Neodymium-based filler | Average particle size of 133 µm | 390.0 | 450.0 | — | 450.0 | — | — | 390.0 | 476.0 |
| | | Average particle size of 33 µm | — | — | 157.8 | — | 157.8 | 157.8 | — | — |
| | Catalyst | Bismuth octylate | 0.60 | 0.12 | 0.13 | — | 0.42 | 0.13 | 0.60 | 0.42 |
| | | Tin octylate | — | — | — | 0.11 | — | — | — | — |
| | Foam stabilizer | L5340 | — | — | — | — | — | — | — | 5.0 |
| | Others | Protective film | Absent | Absent | Absent | Absent | Absent | Absent | Present | Absent |
| | | NCO Index | 0.50 | 0.40 | 1.00 | 0.40 | 1.00 | 1.00 | 0.50 | 1.00 |
| Production conditions | Uneven distribution treatment time (minutes) | | 30 | 30 | 30 | 60 | 3 | 30 | 30 | 10 |
| Results | Elastic modulus (MPa) | | 3.24 | 0.06 | 9.34 | 0.005 | 12.36 | 9.34 | 3.46 | 3.79 |
| | Filler uneven distribution ratio | | 78.4 | 93.2 | 58.4 | 96.8 | 53.2 | 41.6 | 77.3 | 67.3 |
| | Bubble content ratio (vol %) | | 0.0 | 0.0 | 0.0 | 0.0 | 0.0 | 0.0 | 0.0 | 36.2 |
| | Magnetic flux density change (Gauss) | | 0.76 | 0.94 | 0.41 | 0.32 | 0.26 | 0.21 | 0.72 | 0.63 |

(Measurement of Elastic Modulus)

A compression test was carried out at a compression speed of 1 mm/min at room temperature in accordance with JIS K-7312 using autograph AG-X (manufactured by Shimadzu Corporation). For a test piece, a sample having a right circular cylinder shape with a thickness of 12.5 mm and a diameter of 29.0 mm was used. A compression elastic modulus was determined from a stress value at 2.4% to 2.6% strain.

(Filler Uneven Distribution Ratio)

A cross-section (thickness of 1.0 mm) of the fabricated magnetic polyurethane resin was observed at a magnification of 100 times by using a scanning electron microscope—energy dispersive X-ray analyzer (SEM-EDS) (SEM: S-3500N manufactured by Hitachi High-Technologies Corporation, EDS: EMAX model 7021-H manufactured by Horiba, Ltd.) under conditions of an acceleration voltage of 25 kV, a vacuum degree of 50 Pa, and a WD of 15 mm. Further, the existence amount of the Fe element inherent in the magnetic filler was determined by element analysis for In all of Examples 1 to 8, change in the magnetic flux density was detected. Among these. Examples 1 to 3 and Examples 7 and 8 had excellent sensor sensitivity. In Example 4, there is a possibility that the magnetic polyurethane resin underwent positional shift because of having a low elastic modulus. In Example 5, it seems that deformation of the magnetic polyurethane resin was suppressed because the elastic modulus was high. In Example 6, the same magnetic polyurethane resin as in Example 3 was mounted in a reversed manner, and it will be understood that a placement in which the side containing a relatively larger amount of the filler is directed toward the electrode group is preferable. In Example 7 in which the magnetic polyurethane resin was covered with a protective film made of polyethylene having a thickness of 10 µm, sensor sensitivity at a level favorably comparable with that of Example 1 was obtained.

DESCRIPTION OF REFERENCE SIGNS

2 Cell
3 Polymer matrix layer

3a Region on one side
3b Region on the other side
4 Detection unit
5 Protective film
21 Outer casing
22 Electrode group

The invention claimed is:

1. A monitoring sensor for a sealed secondary battery including a sealed outer casing and an electrode group accommodated in an inside of the sealed outer casing, comprising:
 a polymer matrix layer that is disposed in the inside of the sealed outer casing; and
 a detection unit that is disposed on an outside of the sealed outer casing, wherein
 the polymer matrix layer contains a filler that is dispersed therein and that changes an external field in accordance with deformation of the polymer matrix layer, and
 the detection unit detects change in the external field.

2. The monitoring sensor for a sealed secondary battery according to claim 1, wherein
 the polymer matrix layer contains a magnetic filler as the filler, and
 the detection unit detects change in a magnetic field as the external field.

3. The monitoring sensor for a sealed secondary battery according to claim 1, wherein an elastic modulus of the polymer matrix layer is from 0.01 to 10 MPa.

4. The monitoring sensor for a sealed secondary battery according to claim 1, wherein the polymer matrix layer is covered with a protective film for preventing elution into an electrolytic solution.

5. The monitoring sensor for a sealed secondary battery according to claim 1, wherein the filler is unevenly distributed in a thickness direction of the polymer matrix layer, and a region of the polymer matrix layer that is located on one side within the polymer matrix layer and that contains a relatively larger amount of the filler is directed toward the electrode group.

6. The monitoring sensor for a sealed secondary battery according to claim 5, wherein a region of the polymer matrix layer that is located on a side opposite to the one side within the polymer matrix layer and that contains a relatively smaller amount of the filler is formed of a foamed body containing bubbles.

7. The monitoring sensor for a sealed secondary battery according to claim 1, wherein the polymer matrix layer is attached to an inner surface of the outer casing and is disposed to be distant from the electrode group.

8. The monitoring sensor for a sealed secondary battery according to claim 1, wherein the polymer matrix layer is attached to the electrode group.

9. A monitoring method for a sealed secondary battery, the method comprising:
 detecting change in the external field accompanying the deformation of the polymer matrix layer by the detection unit, and detecting internal pressure change or electrode swelling of the sealed secondary battery on a basis of the detected change in the external field, by using the monitoring sensor according to claim 1.

10. A sealed secondary battery, comprising:
 a sealed outer casing and an electrode group accommodated in an inside of the sealed outer casing;
 a polymer matrix layer that is disposed in the inside of the outer casing; and
 a detection unit that is disposed on an outside of the outer casing,
 wherein the polymer matrix layer contains a filler that is dispersed therein and that changes an external field in accordance with deformation of the polymer matrix layer, and
 the detection unit detects change in the external field.

* * * * *